United States Patent
Hagen (10) Patent No.: US 10,879,849 B2
(45) Date of Patent: Dec. 29, 2020

(54) EFFICIENT OPERATION OF MULTI-CARRIER POWER AMPLIFIERS IN DYNAMIC CARRIER SYSTEMS

(71) Applicant: MOTOROLA SOLUTIONS, INC., Chicago, IL (US)

(72) Inventor: Rodney W. Hagen, Lake In The Hills, IL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 16/231,293

(22) Filed: Dec. 21, 2018

(65) Prior Publication Data

US 2020/0204117 A1 Jun. 25, 2020

(51) Int. Cl.
| | |
|---|---|
| H03F 3/68 | (2006.01) |
| H03F 1/02 | (2006.01) |
| H03F 3/24 | (2006.01) |
| H04B 1/04 | (2006.01) |
| H03F 3/21 | (2006.01) |

(52) U.S. Cl.
CPC ............. *H03F 1/0277* (2013.01); *H03F 3/24* (2013.01); *H04B 1/04* (2013.01); *H03F 1/0288* (2013.01); *H03F 3/211* (2013.01); *H03F 3/68* (2013.01); *H04B 2001/0408* (2013.01)

(58) Field of Classification Search
CPC .......... H03F 1/0277; H03F 3/24; H03F 3/211; H03F 3/602; H03F 3/604; H03F 1/0288; H03F 3/72; H03F 3/607; H03F 3/60; H04B 1/04; H04B 2001/0408; H03G 1/0088

USPC ................................ 330/51, 124 R, 295, 286
See application file for complete search history.

(56) References Cited

U.S. PATENT DOCUMENTS

| | | |
|---|---|---|
| 5,543,751 A | 8/1996 | Stedman et al. |
| 5,543,762 A | 8/1996 | Sigmon |
| 5,576,671 A | 11/1996 | Agar, Jr. et al. |
| 5,999,046 A | 12/1999 | Kotzamanis |
| 7,184,490 B1 | 2/2007 | Rybicki et al. |

(Continued)

OTHER PUBLICATIONS

International Search Report and Written Opinion dated Feb. 27, 2020 for related International Application No. PCT/US2019/064952 (14 pages).

*Primary Examiner* — Khanh V Nguyen
(74) *Attorney, Agent, or Firm* — Michael Best & Friedrich LLP (57) ABSTRACT

System and method for efficient operation of power amplifiers in dynamic carrier systems. In one example, the method includes determining a composite RMS power and peak power for a carrier configuration of an RF transmitter, determining a number of active banks of power amplifiers as a function of composite RMS power and peak power, and determining a number of active power amplifiers within a bank of power amplifiers as a function of composite RMS power and peak power. The method also includes activating a first bank of power amplifiers and/or a second bank of power amplifiers based on the determined number of active banks of power amplifiers and activating a subset of a one or more first power amplifiers of the first bank of power amplifiers and a one or more second power amplifiers of the second bank of power amplifiers based on the determined number of active power amplifiers.

20 Claims, 5 Drawing Sheets

(56) References Cited

U.S. PATENT DOCUMENTS

| | | | |
|---|---|---|---|
| 7,599,448 B2 * | 10/2009 | Ahmed | H03F 3/24 |
| | | | 375/300 |
| 7,839,216 B2 * | 11/2010 | Alidio | H03F 1/0266 |
| | | | 330/285 |
| 8,447,245 B2 * | 5/2013 | Staudinger | H03F 1/0222 |
| | | | 330/124 R |
| 9,166,537 B2 * | 10/2015 | Schmidt | H03F 1/0277 |
| 9,276,528 B2 | 3/2016 | Kaehs et al. | |
| 2009/0295483 A1 | 12/2009 | Alidio et al. | |

* cited by examiner

EFFICIENT OPERATION OF MULTI-CARRIER POWER AMPLIFIERS IN DYNAMIC CARRIER SYSTEMS

BACKGROUND OF THE INVENTION

In radio frequency (RF) communication systems, multiple carrier signals are combined using a cavity combiner at a radio frequency (RF) site prior to transmission. Cavity combiners are frequency specific and work over a limited frequency range. When the frequencies of the carriers at the RF site are changed, the cavity combiners need to be manually returned to match the new frequency of the carriers. The cost and labor-intensive process of returning cavity combiners makes the cavity combiners unsuitable for dynamic carrier systems.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Figure 1:
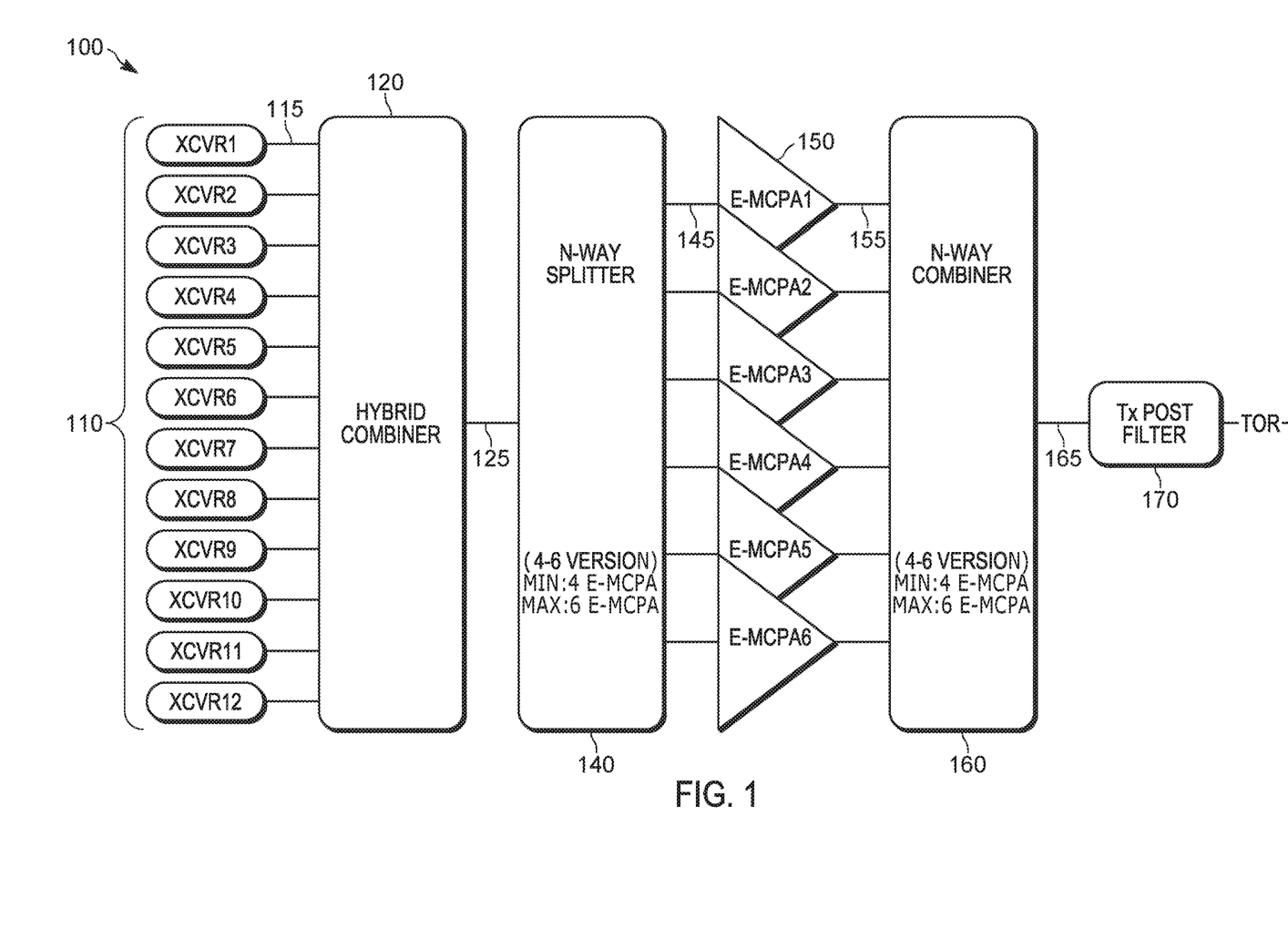
FIG. 1 is a simplified block diagram of a radio frequency (RF) transmitter in accordance with some embodiments.

Multi-carrier power amplifiers eliminate the need for expensive cavity combiner systems and associated preventive maintenance. FIG. 1 is a block diagram of a RF transmitter 100 implemented as part of a radio frequency site. The RF transmitter 100 is, for example, a part of a land mobile radio base station site deployed by a public safety organization (for example, a police department, a fire department, and the like). The RF transmitter 100 may include more or fewer components than those illustrated in FIG. 1 and may perform more or fewer functions than those described herein. In the example illustrated, the RF transmitter 100 includes a plurality of transceivers 110, a hybrid combiner 120 an N-way splitter 140, a plurality of multi-carrier power amplifiers 150, an N-way combiner 160, and a transmission post filter 170. In one example, the RF transmitter 100 can support up to twelve carriers and includes twelve transceivers 110 each designated for a single carrier. The following description is explained with respect to the above example of twelve carriers. However, it will be appreciated that the scope of the present disclosure is also applicable to a RF transmitter 100 having a different number of carriers. The plurality of transceivers 110 generate carrier signals 115, encode the carrier signals 115 with information to be transmitted, and provide the encoded carrier signals 115 to hybrid combiner 120.

The hybrid combiner 120 combines the carrier signals 115 from the plurality of transceivers 110 to provide a combined signal 125 to the N-way splitter 140. The N-way splitter 140 splits the combined signal 125 into split signals 145 corresponding to the number of multi-carrier power amplifiers 150. In the example illustrated, the N-way splitter 140 generates six split signals 145 each corresponding to one of six multi-carrier power amplifiers 150. The split signals 145 are provided to the corresponding multi-carrier power amplifiers 150.

The plurality of multi-carrier power amplifiers 150 are connected in parallel between the N-way splitter 140 and the N-way combiner 160. The plurality of multi-carrier power amplifiers 150 amplify the split signals 145 for transmission and generate amplified signals 155. In some embodiments, a pre-distortion loop and a feed forward correction loop may be provided for each multi-carrier power amplifier 150 to reduce the distortion caused by the multi-carrier power amplifier 150 in the amplified signals 155. The amplified signals 155 are provided to the N-way combiner 160. The N-way combiner 160 combines the amplified signals 155 into a transmission signal 165 that is sent to through the transmission post filter 170 prior to broadcasting with an antenna into the radio frequency spectrum. The N-way splitter 140 and the N-way combiner 160 are, for example, N-way splitters/combiners that are designed for a minimum number and a maximum number of multi-carrier power amplifiers 150 connected in parallel. An example N-way splitter/combiner system is provided in U.S. Pat. No. 5,543, 751, the entire contents of which are hereby incorporated by reference. In the example illustrated, the N-way splitter 140 and the N-way combiner 160 are designed for a minimum of four multi-carrier power amplifiers 150 and a maximum of six multi-carrier power amplifiers 150.

The N-way splitting and combining systems perform well over their intended range of minimum and maximum number of activated multi-carrier power amplifiers 150. However, when dealing with a relatively large dynamic range of carrier frequencies, as is the case in public safety LMR implementations, the N-way splitting and combining systems result in large inefficiencies in power consumption. The example illustrated in FIG. 1 works well when the carrier configuration includes activation of seven to twelve carriers. When seven to twelve carriers are used for transmission, four to six multi-carrier power amplifiers 150 may be used to amplify the carrier signals 115. Since the RF transmitter 100 is designed for a minimum of four and a maximum of six activated multi-carrier power amplifiers 150, the RF transmitter 100 operates efficiently for seven to twelve activated carriers. When only one to six carriers are used for transmission, less than four multi-carrier power amplifiers 150 can be used to amplify the carrier signals 115. However, since the N-way splitter 140 and the N-way combiner 160 are designed for a minimum of four multi-carrier power amplifiers 150, at least four multi-carrier power amplifiers 150 are activated even when only one-to six carriers are used for transmission. That is, the RF transmitter 100 is not scalable below four multi-carrier power amplifiers 150 based on the desired number of carriers or the carrier configuration. This results in excess capacity and power consumptions when less than seven carriers are activated for transmission at the RF transmitter 100.

Accordingly, there is a need for extending the efficient operational dynamic power range of multi-carrier power amplifiers 150 in dynamic carrier systems.

One embodiment provides a radio frequency transmitter including a first bank of power amplifiers having a one or more first power amplifiers, a second bank of power amplifiers having a one or more second power amplifiers, and an electronic processor coupled to the first bank of power amplifiers and the second bank of power amplifiers. The electronic processor is configured to determine a composite root mean square (RMS) power and peak power for a carrier configuration and determine a number of active banks of power amplifiers as a function of composite RMS power and peak power. The electronic processor is also configured to determine a number of active power amplifiers within a bank of power amplifiers as a function of composite RMS power and peak power. The electronic processor is also configured to activate one selected from a group consisting of the first bank of power amplifiers and the second bank of power amplifiers based on the determined number of active banks of power amplifiers, and activate a subset of the one or more first power amplifiers and the one or more second power amplifiers based on the determined number of active power amplifiers within a bank.

Another embodiment provides a method for efficient operation of power amplifiers in dynamic carrier systems. The method includes determining, using an electronic processor of a radio frequency (RF) transmitter, a composite root mean square (RMS) power and peak power for a carrier configuration and determining, using the electronic processor, a number of active banks of power amplifiers as a function of composite RMS power and peak power. The method also includes determining, using the electronic processor, a number of active power amplifiers within a bank of power amplifiers as a function of composite RMS power and peak power and activating, using the electronic processor, one selected from a group consisting of a first bank of power amplifiers and a second bank of power amplifiers based on the determined number of active banks of power amplifiers. The first bank of power amplifiers includes a one or more first power amplifiers and the second bank of power amplifiers includes a one or more second power amplifiers. The method also includes activating, using the electronic processor, a subset of the one or more first power amplifiers and the one or more second power amplifiers based on the determined number of active power amplifiers.

Figure 2:
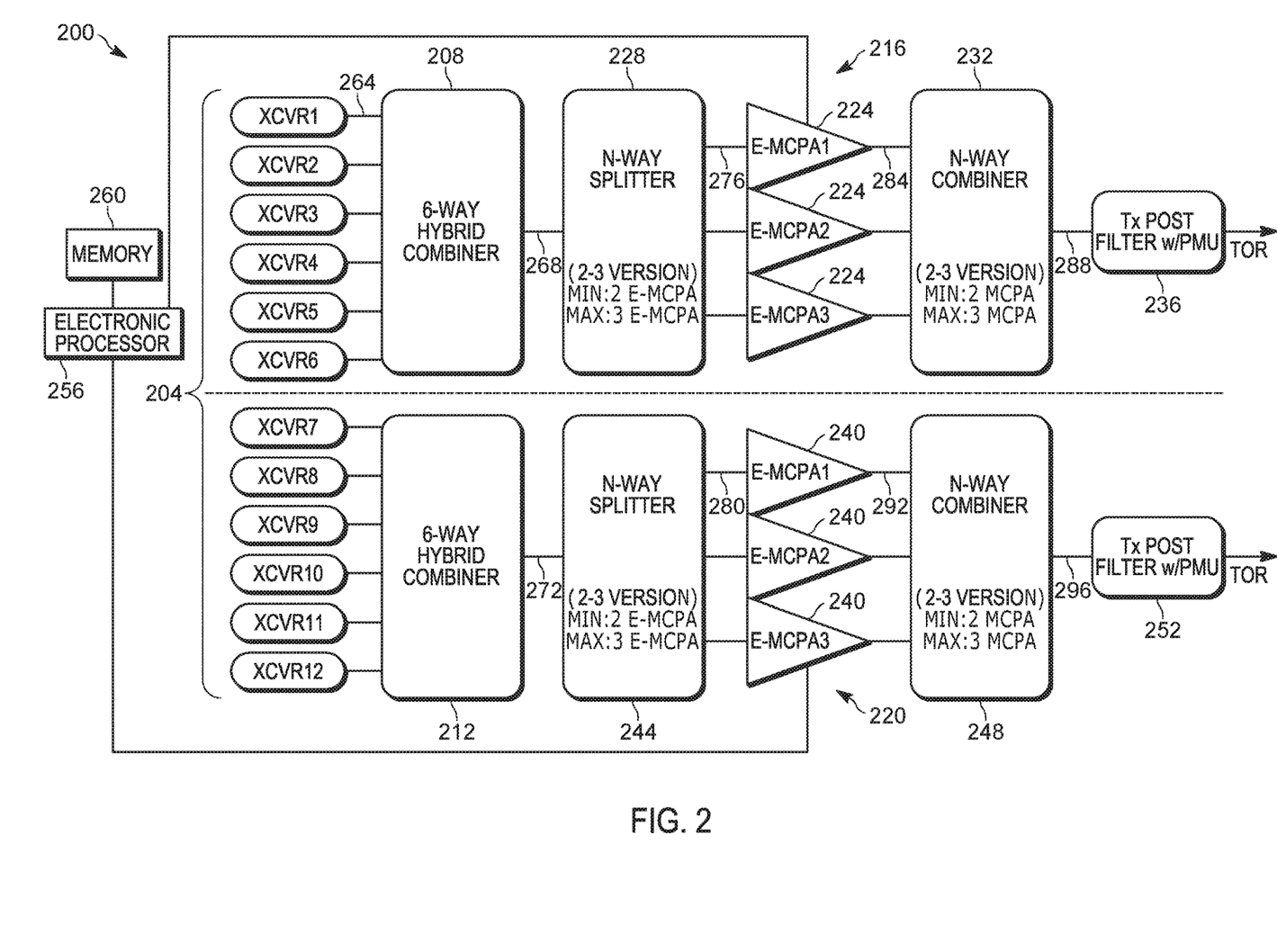
FIG. 2 is a simplified block diagram of a RF transmitter in accordance with some embodiments.

FIG. 2 is a block diagram of a RF transmitter 200. The RF transmitter 200 is, for example, a part of a land mobile radio base station site deployed by a public safety organization (for example, a police department, a fire department, and the like). The RF transmitter 200 may include more or fewer components than those illustrated in FIG. 2 and may perform more or fewer functions than those described herein. In the example illustrated, the RF transmitter 200 includes a plurality of transceivers 204, a first hybrid combiner 208, and a second hybrid combiner 212. The RF transmitter 200 also includes a first bank of power amplifiers 216 and a second bank of power amplifiers 220. The first bank of power amplifiers 216 includes one or more power amplifiers 224 (sometimes referred to as the "first power amplifiers 224"). The first bank of power amplifiers 216 is coupled to a first N-way splitter 228 and a first N-way combiner 232. A first transmission post filter 236 is coupled to the first N-way combiner 232. The second bank of power amplifiers 220 includes one or more power amplifiers 240 (sometimes referred to as the "second power amplifiers 240"). The second bank of power amplifiers 220 is coupled to a second N-way splitter 244 and a second N-way combiner 248. A second transmission post filter 252 is coupled to the second N-way combiner 248. In some embodiments the first power amplifiers 224 and the second power amplifiers 240 are single-carrier power amplifiers. In other embodiments, the first power amplifiers 224 and the second power amplifiers 240 are multi-carrier power amplifiers.

An electronic processor 256 is coupled to the first bank of power amplifiers 216 and the second bank of power amplifiers 220 and provides control signals to the first power amplifiers 224 and the second power amplifiers 240 to activate or disable the power amplifiers 224 and the power amplifiers 240. The electronic processor 256 may disable a bank of power amplifiers 216, 220 by disabling all the power amplifiers 224, 240 of the bank of power amplifiers 216, 220. The electronic processor 256 is also coupled to a memory 260. In some embodiments, the electronic processor 256 is implemented as a microprocessor with separate memory, for example, the memory 260. In other embodiments, the electronic processor 256 is implemented as a microcontroller or digital signal processor (with memory 260 on the same chip). In other embodiments, the electronic processor 256 is implemented using multiple processors. In addition, the electronic processor 256 may be implemented partially or entirely as, for example, a field-programmable gate array (FPGA), an application specific integrated circuit (ASIC), and the like and the memory 260 may not be needed or be modified accordingly. In the example illustrated, the memory 260 includes non-transitory, computer-readable memory that stores instructions that are received and executed by the electronic processor 256 to carry out the functionality of the RF transmitter 200 described herein. The memory 260 may include, for example, a program storage area and a data storage area. The program storage area and the data storage area may include combinations of different types of memory, for example, read-only memory and random-access memory.

All the components of the RF transmitter 200 may be provided in the same RF site cabinet. Therefore, the first bank of power amplifiers 216 and the second bank of power amplifiers 220 have a substantially similar geographic radio frequency coverage area. That is, the first bank of power amplifiers 216 and the second bank of power amplifiers 220 provide coverage to user equipment (for example, portable two-way radios) located within the geographic coverage area of the RF transmitter 200. The following description is explained with respect to the above example of twelve carriers. However, it will be appreciated that the scope of the present disclosure is also applicable to a RF transmitter 200 having a different number of carriers. The first bank of power amplifiers 216 are assigned to a first subset of the plurality of transceivers 204 (for example, first six transceivers 204). The second bank of power amplifiers 220 are assigned to a second subset of the plurality of transceivers 204 (for example, second six transceivers 204). The plurality of transceivers 204 generate carrier signals 264, encode the carrier signals 264 with information to be transmitted, and provide the encoded carrier signals 264 to the first hybrid combiner 208 and the second hybrid combiner 212.

The first hybrid combiner 208 combines the carrier signals 264 from a first subset of the plurality of transceivers 204 (for example, first six transceivers 204) to provide a first combined signal 268 to the first N-way splitter 228. The second hybrid combiner 212 combines the carrier signals 264 from a second subset of the plurality of transceivers 204 (for example, second six transceivers 204) to provide a second combined signal 272 to the second N-way splitter 244. The first N-way splitter 228 splits the first combined signal 268 into first split signals 276 corresponding to the number of the power amplifiers 224. In the example illustrated the first N-way splitter 228 generates three first split signals 276 each corresponding to one of the power amplifiers 224. The first split signals 276 are provided to the corresponding power amplifiers 224. The second N-way splitter 244 splits the second combined signal 272 into second split signals 280 corresponding to the number of power amplifiers 240. In the example illustrated, the second N-way splitter 244 generates three second split signals 280 each corresponding to one of the power amplifiers 240. The second split signals 280 are provided to the corresponding power amplifiers 240.

The first power amplifiers 224 are connected in parallel between the first N-way splitter 228 and the first N-way combiner 232. The first N-way splitter 228 and the first N-way combiner 232 are together referred to as the first N-way splitter-combiner system 228, 232. In other words, the first N-way splitter-combiner system 228, 232 is coupled to the first bank of power amplifiers 216. The first bank of power amplifiers 216 amplify the first split signals 276 for transmission and generate first amplified signals 284. In some embodiments, a pre-distortion loop and a feed forward correction loop may be provided for each power amplifier 224 to reduce the distortion caused by the power amplifier 224 in the first amplified signals 284. The first amplified signals 284 are provided to the first N-way combiner 232. The first N-way combiner 232 combines the first amplified signals 284 into a first transmission signal 288 that is sent through the first transmission post filter 236 prior to broadcasting into the RF spectrum through an antenna. The second one or more power amplifiers 240 are connected in parallel between the second N-way splitter 244 and the second N-way combiner 248. The second N-way splitter 244 and the second N-way combiner 248 are together referred to as the second N-way splitter-combiner system 244, 248. In other words, the second N-way splitter-combiner system 244, 248 is coupled to the second bank of power amplifiers 220. The second bank of power amplifiers 220 amplify the second split signals 280 for transmission and generate second amplified signals 292. In some embodiments, a pre-distortion loop and a feed forward correction loop may be provided for each power amplifier 240 to reduce the distortion caused by the power amplifier 240 in the second amplified signals 292. The second amplified signals 292 are provided to the second N-way combiner 248. The second N-way combiner 248 combines the second amplified signals 292 into a second transmission signal 296 that is sent through the second transmission post filter 252 prior to broadcasting into the RF spectrum through an antenna.

The first N-way splitter 228, the first N-way combiner 232, the second N-way splitter 244, and the second N-way combiner 248 are, for example, N-way splitters/combiners that are designed for a minimum number and a maximum number of power amplifiers 224, 240 connected in parallel. An example N-way splitter/combiner system is provided in U.S. Pat. No. 5,543,751, the entire contents of which are hereby incorporated by reference. In the example illustrated in FIG. 2, the first N-way splitter 228, the first N-way combiner 232, the second N-way splitter 244, and the second N-way combiner 248 are designed for a minimum of two power amplifiers 224, 240 and a maximum of three power amplifiers 224, 240.

Figure 3:
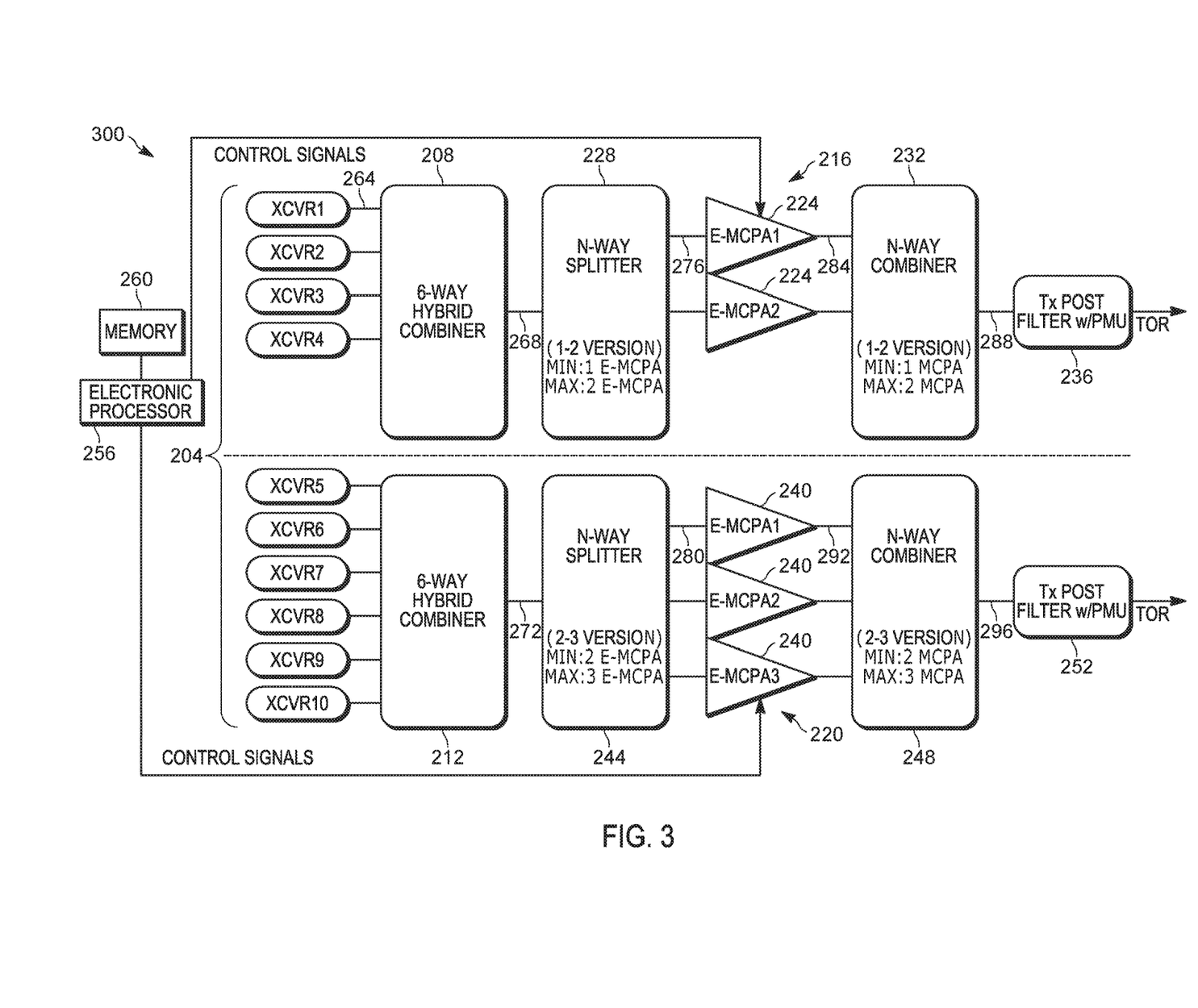
FIG. 3 is a simplified block diagram of a RF transmitter in accordance with some embodiments.

In the example illustrated in FIG. 2, the first bank of power amplifiers 216 and the second bank of power amplifiers 220 are symmetric. That is, the first bank of power amplifiers 216 and the second bank of power amplifiers 220 include the same number of power amplifiers 224, 240 and/or the same number of minimum and maximum power amplifiers 224, 240. Additionally, the first one or more power amplifiers 224 are identical to the second one or more power amplifiers 240. That is, the first one or more power amplifiers 224 have similar peak and root mean square (RMS) capability as the second one or more power amplifiers 240. In some embodiments, the first bank of power amplifiers 216 and the second bank of power amplifiers 220 are asymmetric. That is, the first bank of power amplifiers 216 and the second bank of power amplifiers 220 include the different number of power amplifiers 224, 240 (as shown in FIG. 3). Or, alternatively, the first one or more power amplifiers 224 are not identical to the second one or more power amplifiers 240. That is, the first one or more power amplifiers 224 have different peak and root mean square (RMS) capability as the second one or more power amplifiers 240.

FIG. 3 illustrates an RF transmitter 300 in accordance with some embodiments. The RF transmitter 300 is similar to the RF transmitter 200 and includes similar components. In the example illustrated, the first bank of power amplifiers 216 is asymmetrical to the second bank of power amplifiers 220. That is, the first bank of power amplifiers 216 and the second bank of power amplifiers 220 include the different number of power amplifiers 224, 240 and/or different number of minimum and maximum power amplifiers 224, 240. However, the first one or more power amplifiers 224 may be identical to (that is, symmetric) or different from (that is, asymmetric) the second one or more power amplifiers 240. In the example illustrated in FIG. 3, the first N-way splitter 228 and the first N-way combiner 232 are designed for a minimum of one power amplifier 224 and a maximum of two power amplifiers 224. Additionally, the first hybrid combiner 208 combines a first four transceivers 204 to provide carrier signals 264 to the first bank of power amplifiers 216 and the second hybrid combiner 212 combines a second six transceivers 204 to provide carrier signals 264 to the second bank of power amplifiers 220. As discussed above, all the components of the RF transmitter 300 may be provided in the same RF site cabinet. Therefore, the first bank of power amplifiers 216 and the second bank of power amplifiers 220 have a substantially similar geographic radio frequency coverage area. That is, the first bank of power amplifiers 216 and the second bank of power amplifiers 220 provide coverage to user equipment (for example, portable two-way radios) located within the geographic coverage area of the RF transmitter 300.

FIG. 3 illustrates an example having ten carriers. However, it can be appreciated that the RF transmitter 300 can be adapted to include any number of carriers. For example, the RF transmitter 300 can be adapted for twelve carriers by designing the second N-way splitter 244 and the second N-way combiner 248 for a minimum of two power amplifiers 240 and a maximum of four power amplifiers 240. Additionally, the second hybrid combiner 212 may be used to combine a second eight transceivers 204 to provide carrier signals 264 to the second bank of power amplifiers 220. The RF transmitter 200, 300 may also be adapted to include more than two banks of power amplifiers 216, 220 based on the number of carriers at the RF transmitter 200, 300.

The RF transmitters 200 and 300 are dynamic carrier systems. That is, the carrier configuration for transmission are scheduled to change at predetermined intervals. The carrier configuration includes, for example, a number of carriers activated (for example, carrier count of the RF transmitter 200, 300), a power requirement of the activated carriers (for example, carrier power of the RF transmitter 200, 300), a peak to average ratio (for example, a carrier peak to average ratio), a modulation type (for example, a carrier modulation type), and the bandwidth of the activated carriers (for example, carrier bandwidth of the RF transmitter 200, 300). The electronic processor 256 may include a multi-carrier scheduler module or communicate with a multi-carrier scheduler module of the RF transmitter 200, 300 to determine the carrier configuration of the RF transmitter 200, 300. The multi-carrier scheduler changes the carrier configuration after every predetermined period of time. For example, the multi-carrier scheduler may change the carrier configuration every 20 milliseconds. Accordingly, each carrier configuration is active for a timeslot of 20 milliseconds.

Figure 4:
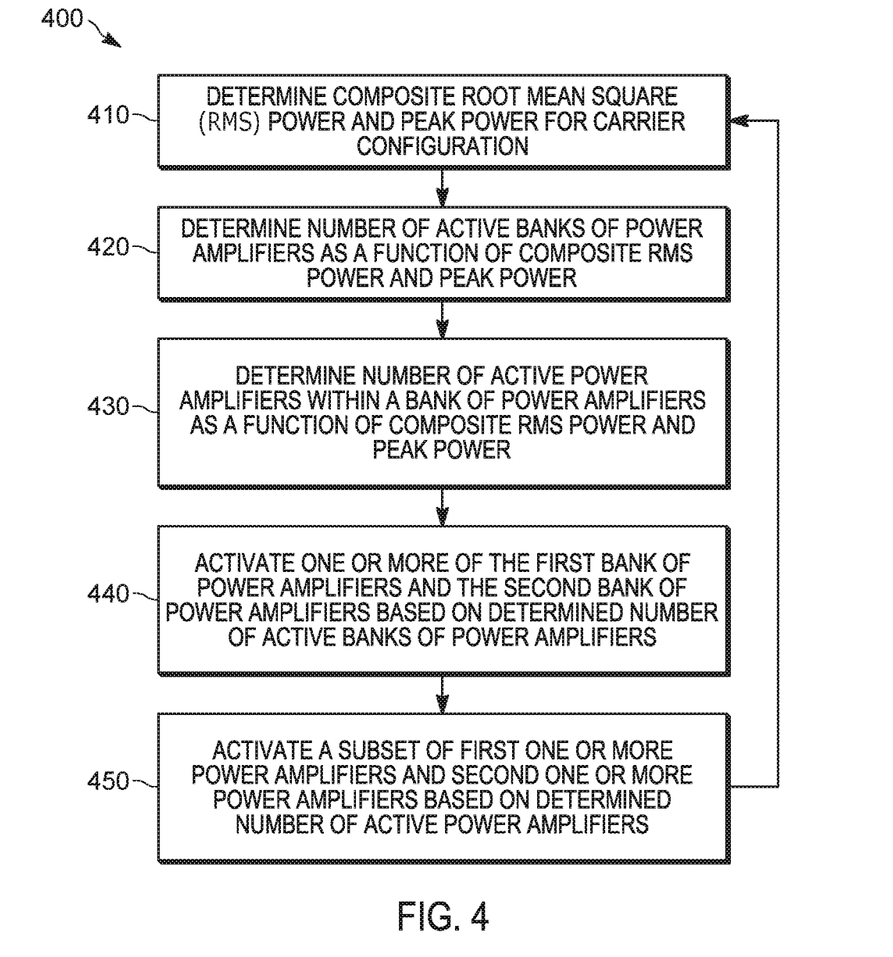
FIG. 4 is a flowchart of a method for efficient operation of power amplifiers of FIGS. 2 and 3 in dynamic carrier systems in accordance with some embodiments.

FIG. 4 is a flowchart of an example method 400 for operation of power amplifiers 224, 240 in a dynamic carrier systems. In the example illustrated, the method 400 includes determining, using the electronic processor 256 of the RF transmitter 200, 300, a composite root mean square (RMS) power and peak power for a carrier configuration (at block 410). The electronic processor 256 communicates with the multi-carrier scheduler to determine the carrier configuration. The electronic processor 256 uses the carrier configuration information (that can include, carrier count, carrier power, carrier peak to average ratio, carrier bandwidth, carrier modulation type, or the like) to determine the composite RMS power and the peak power for the carrier configuration.

The method 400 also includes determining, using the electronic processor 256, a number of active banks of power amplifiers 216, 220 as a function of composite RMS power and peak power (at block 420). For example, the electronic processor 256 determines based on the composite RMS power and peak power whether both banks of power amplifiers 216, 220 are to be activated or whether one of the first bank of power amplifiers 216 and the second bank of power amplifiers 220 can be disabled for the current carrier configuration to realize power savings. The electronic processor 256 may later activate the disabled bank of power amplifiers 220 for a different carrier configuration. The electronic processor 256 performs a graceful migration of carrier between banks during a change in carrier configuration. Graceful migration is performed when first transitioning a carrier to a more desirably sized or capable bank and then disabling the less desirable sized or capable bank such that there is no loss in coverage.

The method 400 also includes determining, using the electronic processor 256, a number of active power amplifiers 224, 240 within a bank of power amplifiers 216, 220 as a function of composite RMS power and peak power (at block 430). That is, the electronic processor 256 determines how many of the first power amplifiers 224 and the second power amplifiers 240 are to be activated to for the current carrier configuration.

The method 400 includes activating, using the electronic processor 256, one or more of the first bank of power amplifiers 216 and the second bank of power amplifiers 220 based on the determined number of active banks of power amplifiers 216, 220 (at block 440). For example, in the example illustrated in FIG. 3, the electronic processor 256 activates the first bank of power amplifiers 216 and disables the second bank of power amplifiers 220 when the carrier configuration includes a carrier count of one to four carriers. The electronic processor 256 activates the second bank of power amplifiers 220 and disables the first bank of power amplifiers 216 when the carrier configuration includes a carrier count of five to six carriers. The electronic processor 256 activates both the first bank of power amplifiers 216 and the second bank of power amplifiers 220 when the carrier configuration includes a carrier count of seven to ten carriers.

The method 400 also includes activating, using the electronic processor 256, a subset of the first one or more power amplifiers 224 and the second one or more power amplifiers 240 based on the determined number of active power amplifiers 224, 240 (at block 450). For example, in the example illustrated in FIG. 3, the electronic processor 256 activates only one power amplifier 224 of the first bank of power amplifiers 216 and deactivates all the power amplifiers 240 of the second bank of power amplifiers 216 when the carrier configuration includes a carrier count of one to two carriers. The electronic processor 256 activates only one power amplifier 224 of the first bank of power amplifiers 216 and activates all three of the power amplifiers 240 of the second bank of power amplifiers 220 when the carrier configuration includes a carrier count of seven to eight carriers. The electronic processor 256 activates both power amplifiers 224 of the first bank of power amplifiers 216 and deactivates all the power amplifiers 240 of the second bank of power amplifiers 220 when the carrier configuration includes a carrier count of three to four carriers. The electronic processor 256 activates both power amplifiers 224 of the first bank of power amplifiers 216 and activates all three of the power amplifiers 240 of the second bank of power amplifiers 220 when the carrier configuration includes a carrier count of nine to ten carriers. The number of active power amplifiers 240 in the second bank of power amplifiers 216 can be varied similar to the first bank of power amplifiers 216. That is, rather than none or all, the number of active power amplifiers 240 in the second bank of power amplifiers 216 can be varied between two and three based on the carrier count.

In some embodiments, the electronic processor 256 also determines an allocation of carrier frequencies to the first bank of power amplifiers 216 and the second bank of power amplifiers 220. The electronic processor 256 then activates the subset of the first one or more power amplifiers 224 and/or the second one or more power amplifiers 240 with the allocated carrier frequencies. For example, the electronic processor 256 may control the routing between the plurality of transceivers 204, the first N-way splitter-combiner system 228, 232, and the second N-way splitter-combiner system 244, 248 to allocate different carriers with different frequencies to one of the power amplifiers 224, 240. In one example, the electronic processor 256 allocates a trunking control channel to the first bank of power amplifiers 216. In this example, when no voice carriers are needed during transmission, the second bank of power amplifiers 220 can be deactivated.

Figure 5:
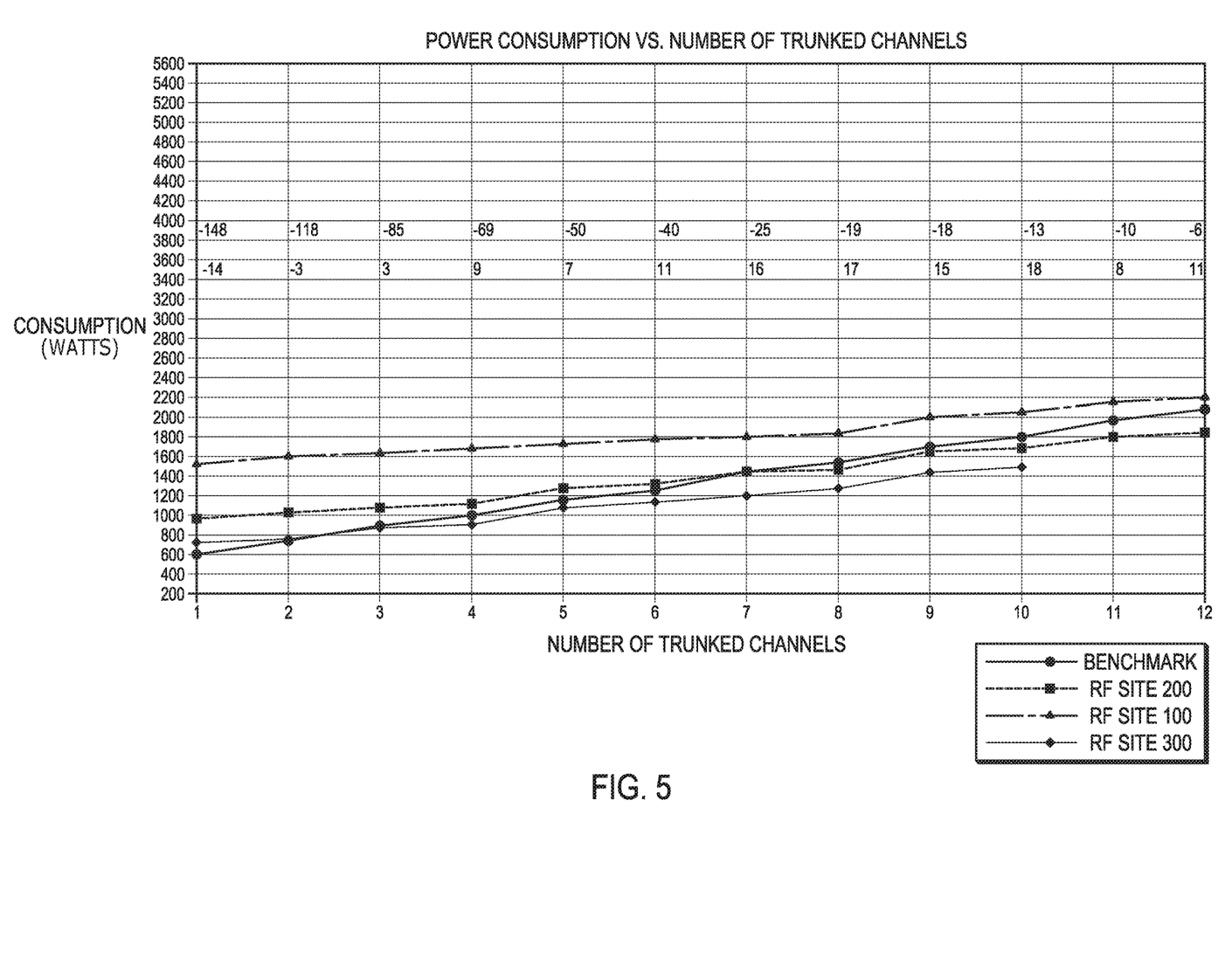
FIG. 5 is a graphical representation of the power savings provided by the RF transmitters of FIGS. 3 and 4 in accordance with some embodiments.

By, providing the power amplifiers 224, 240 in selectively activate-able banks, the RF transmitters 200, 300 provide significant power savings. FIG. 5 graphically illustrates the power savings offered by RF transmitters 200, 300 over an industry benchmark and the RF transmitter 100 that does not include banks of power amplifiers 216, 220. The RF transmitter 200 offers 400-600 Watts of power savings over the RF transmitter 100 and the RF transmitter 300 offers 600-800 Watts of power savings over the RF transmitter 100 based on the number of trunked channels.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

I claim:

1. A radio frequency transmitter comprising:
a first bank of power amplifiers including one or more first power amplifiers;
a second bank of power amplifiers including one or more second power amplifiers;
an electronic processor coupled to the first bank of power amplifiers and the second bank of power amplifiers and configured to
determine a composite root mean square (RMS) power and peak power for a carrier configuration,
determine a number of active banks of power amplifiers as a function of the composite RMS power and peak power,
determine a number of active power amplifiers within a bank of power amplifiers as a function of the composite RMS power and peak power,
activate one selected from a group consisting of the first bank of power amplifiers and the second bank of power amplifiers based on the determined number of active banks of power amplifiers, and
activate a subset of the one or more first power amplifiers and the one or more second power amplifiers based on the determined number of active power amplifiers.

2. The radio frequency transmitter of claim 1, further comprising a first N-way splitter-combiner system coupled to the first bank of power amplifiers.

3. The radio frequency transmitter of claim 2, further comprising a second N-way splitter-combiner system coupled to the second bank of power amplifiers.

4. The radio frequency transmitter of claim 1, wherein the electronic processor is further configured to:
determine an allocation of carrier frequencies to the first bank of power amplifiers; and
activate the subset of the one or more first power amplifiers with the allocated carrier frequencies.

5. The radio frequency transmitter of claim 1, wherein the electronic processor is further configured to:
determine an allocation of carrier frequencies to the second bank of power amplifiers; and
activate the subset of the one or more second power amplifiers with the allocated carrier frequencies.

6. The radio frequency transmitter of claim 1, wherein the one or more first power amplifiers and the one or more second power amplifiers are multi-carrier power amplifiers.

7. The radio frequency transmitter of claim 6, wherein the first bank of power amplifiers and the second bank of power amplifiers are symmetric.

8. The radio frequency transmitter of claim 6, wherein the first bank of power amplifiers and the second bank of power amplifiers are asymmetric.

9. The radio frequency transmitter of claim 1, wherein the first bank of power amplifiers and the second bank of power amplifiers have substantially similar geographic radio frequency coverage area.

10. The radio frequency transmitter of claim 1, wherein the carrier configuration includes at least one selected from a group consisting of a carrier count of the radio frequency transmitter; a carrier power of the radio frequency transmitter, a carrier peak to average ratio, a carrier modulation type, and a carrier bandwidth of the radio frequency transmitter.

11. A method for efficient operation of power amplifiers in dynamic carrier systems, the method comprising:
determining, using an electronic processor of a radio frequency (RF) transmitter, a composite root mean square (RMS) power and peak power for a carrier configuration,
determining, using the electronic processor, a number of active banks of power amplifiers as a function of the composite RMS power and peak power,
determining, using the electronic processor, a number of active power amplifiers within a bank of power amplifiers as a function of the composite RMS power and peak power,
activating, using the electronic processor, one selected from a group consisting of a first bank of power amplifiers and a second bank of power amplifiers based on the determined number of active banks of power amplifiers, the first bank of power amplifiers including one or more first power amplifiers and the second bank of power amplifiers including one or more second power amplifiers; and
activating, using the electronic processor, a subset of the one or more first power amplifiers and the one or more second power amplifiers based on the determined number of active power amplifiers.

12. The method of claim 11, wherein a first N-way splitter-combiner system is coupled to the first bank of power amplifiers.

13. The method of claim 11, wherein a second N-way splitter-combiner system is coupled to the second bank of power amplifiers.

14. The method of claim 11, further comprising:
determining an allocation of carrier frequencies to the first bank of power amplifiers; and
activating the subset of the one or more first power amplifiers with the allocated carrier frequencies.

15. The method of claim 11, further comprising:
determining an allocation of carrier frequencies to the second bank of power amplifiers; and
activating the subset of the one or more second power amplifiers with the allocated carrier frequencies.

16. The method of claim 11, wherein the one or more first power amplifiers and the one or more second power amplifiers are multi-carrier power amplifiers.

17. The method of claim 16, wherein the first bank of power amplifiers and the second bank of power amplifiers are symmetric.

18. The method of claim 16, wherein the first bank of power amplifiers and the second bank of power amplifiers are asymmetric.

19. The method of claim 11, wherein the first bank of power amplifiers and the second bank of power amplifiers have substantially similar geographic radio frequency coverage area.

20. The method of claim 11, wherein the carrier configuration includes at least one selected from a group consisting of a carrier count of the radio frequency transmitter; a carrier power of the radio frequency transmitter, a carrier peak to average ratio, a carrier modulation type, and a carrier bandwidth of the radio frequency transmitter.

* * * * *